United States Patent
Kim et al.

(10) Patent No.: US 9,392,198 B2
(45) Date of Patent: Jul. 12, 2016

(54) BACKSIDE ILLUMINATED IMAGING SYSTEMS HAVING AUTO-FOCUS PIXELS

(71) Applicant: Semiconductor Components Industries, LLC, Phoenix, AZ (US)

(72) Inventors: Dongsoo Kim, San Jose, CA (US); Kwang-bo Cho, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 54 days.

(21) Appl. No.: 14/191,209

(22) Filed: Feb. 26, 2014

(65) Prior Publication Data

US 2015/0244957 A1    Aug. 27, 2015

(51) Int. Cl.
*H04N 5/369* (2011.01)
*H04N 9/04* (2006.01)
*H01L 27/146* (2006.01)

(52) U.S. Cl.
CPC .......... *H04N 5/3696* (2013.01); *H01L 27/1464* (2013.01); *H01L 27/14621* (2013.01); *H01L 27/14623* (2013.01); *H04N 9/045* (2013.01)

(58) Field of Classification Search
CPC ................. H04N 5/3696; H04N 9/045; H01L 27/14621; H01L 27/14623; H01L 27/1464
See application file for complete search history.

(56) References Cited

U.S. PATENT DOCUMENTS

| | | | |
|---|---|---|---|
| 8,384,820 B1 | 2/2013 | Lohier et al. | |
| 2010/0214453 A1* | 8/2010 | Murata | 348/266 |
| 2011/0279727 A1* | 11/2011 | Kusaka | 348/340 |
| 2012/0062786 A1* | 3/2012 | Hamano | G02B 7/38 348/345 |
| 2012/0146947 A1* | 6/2012 | Massetti | 345/175 |
| 2012/0188425 A1* | 7/2012 | Kita | 348/294 |
| 2012/0273906 A1 | 11/2012 | Mackey et al. | |
| 2012/0314121 A1 | 12/2012 | Tay | |
| 2013/0027577 A1 | 1/2013 | Holscher et al. | |

\* cited by examiner

*Primary Examiner* — Mekonnen Dagnew
(74) *Attorney, Agent, or Firm* — Treyz Law Group, P.C.; Michael H. Lyons

(57) ABSTRACT

An imaging system may be provided with a backside illuminated pixel array that includes imaging pixels and rows of auto-focus pixels. The imaging pixels may generate image data and the auto-focus pixels may generate application-specific data. The imaging pixels may be provided with an array of color filters. The auto-focus pixels may be provided with rows of color filters that are offset with respect to the imaging pixel color filters. The auto-focus pixel color filters may include clear color filters and opaque color filters for blocking image light received at selected incident angles. The system may include an adjustable lens that focuses light onto the pixel array. The pixel array may be coupled to processing circuitry that determines whether an image is focused based on the application-specific data and may adjust the lens in response to determining that the image is not focused.

18 Claims, 4 Drawing Sheets

BACKSIDE ILLUMINATED IMAGING SYSTEMS HAVING AUTO-FOCUS PIXELS

BACKGROUND

This relates generally to imaging devices, and more particularly, to imaging devices with backside illuminated image sensors having application-specific auto-focus pixels.

Image sensors are commonly used in electronic devices (sometimes referred to herein as imagers) such as cellular telephones, cameras, and computers to capture images. Conventional image sensors are fabricated on a semiconductor substrate using complementary metal-oxide-semiconductor (CMOS) technology or charge-coupled device (CCD) technology. The image sensors have arrays of pixels. Each pixel has a photosensor such as a photodiode. Conventional image pixel arrays include frontside illuminated image pixels or backside illuminated image pixels.

Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. Metal routing lines and metal vias may be formed over the front surface of the substrate. In addition to capturing images of a scene, some imagers may be capable of performing other functions. Imagers can sometimes include application-specific pixels that are capable of generating signals for performing auto-focusing operations with the imager.

In general, received image light needs to be blocked over some incident angles in order for application-specific pixels to be used for auto-focusing. In frontside illuminated image sensors in which image light is received by the photodiodes through the front surface of the substrate, some angles of incident light are blocked by the metal routing lines at the front side of the substrate. However, in conventional image sensors, there are no metal lines formed over the backside of the substrate, making it difficult for backside illuminated sensors in which image light is received by the photodiodes through the back surface of the substrate to perform auto-focusing operations.

It would therefore be desirable to be able to provide imaging devices with improved backside illuminated image sensors.

DETAILED DESCRIPTION

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements, and, if desired, other processing circuitry such as analog processing circuitry and digital processing circuitry. Image sensors may be front-side illumination (FSI) image sensors or backside illumination (BSI) image sensors. An image sensor may be coupled to additional processing circuitry such as circuitry on a companion chip to the image sensor, circuitry in the device that is coupled to the image sensor by one or more cables or other conductive lines, or external processing circuitry.

Figure 1:
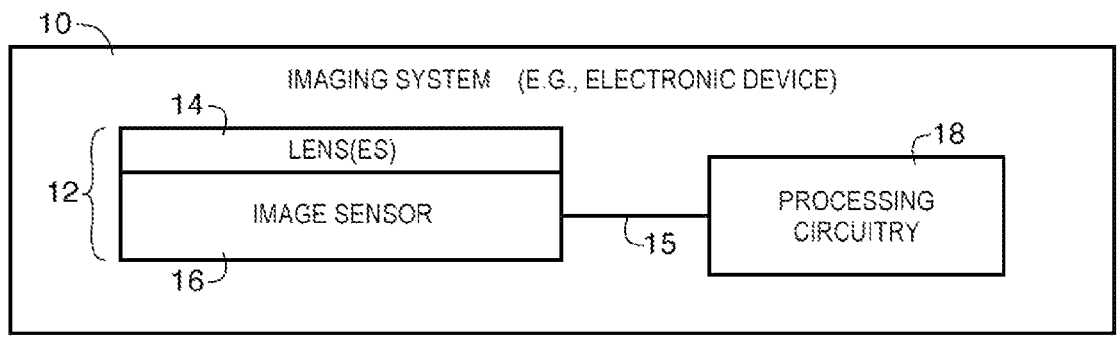
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18 over path 15. Image sensor 16 may, for example, be a backside illumination image sensor. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

If desired, processing circuitry 18 may provide control signals to image sensor 16 and/or lenses 14 over path 15. For example, lenses 14 may have an adjustable focus (e.g., an adjustable focus length) so that light from objects in an imaged scene that are located at different distances from camera module 12 is selectively focused onto image sensor 16. Processing circuitry 18 may convey control signals to lenses 14 to adjust the focus of lenses 14 (e.g., to focus on objects at a certain distance from camera module 12). The focus of lenses 14 may be adjusted manually (e.g., by a user of device 10) or may be adjusted automatically using processing circuitry 18 in a process sometimes referred to herein as auto-focusing or auto-focus operations. Processing circuitry 18 may analyze image data captured by image sensor 16 to determine a focal point in an imaged scene and may instruct lenses 14 to focus on the focal point so that subsequently captured image data is focused on that focal point in the scene.

Figure 2:
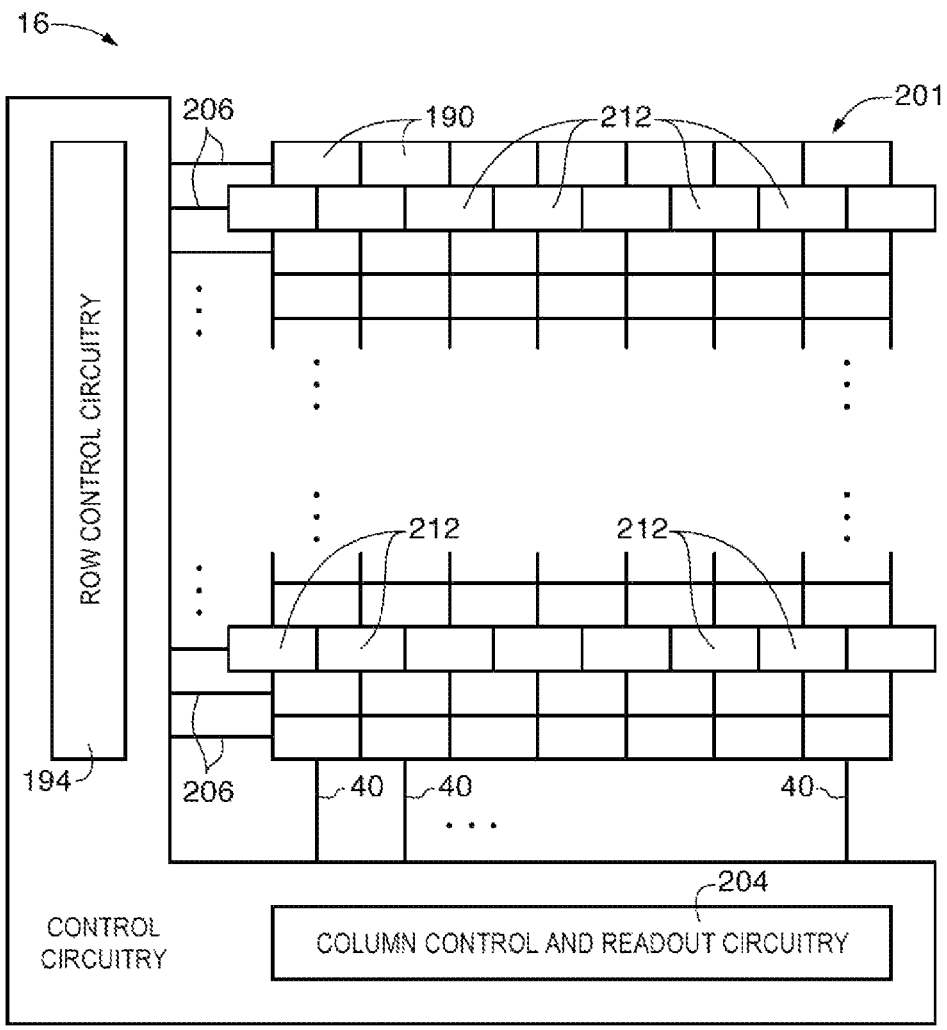
FIG. 2 is a diagram of an illustrative pixel array having imaging pixels and rows of application-specific auto-focus pixels and associated control circuitry for generating control signals and reading out pixel data in an image sensor in accordance with an embodiment of the present invention.

As shown in FIG. 2, image sensor 16 may include a pixel array such as pixel array 201 containing imaging pixels such as image sensor pixels 190 and application-specific pixels such as application-specific pixels 212. Imaging pixels 190 may be configured to gather image data to be used in generating images of a scene. Application-specific pixels 212 may be configured to gather data to be used for a specific application. For example, data gathered by application-specific pixels 212 may be used for auto-focusing applications, depth-sensing applications (e.g., three dimensional imaging applications), face detection applications, and/or other applications. Application-specific pixels 212 may sometimes be referred to herein as auto-focus image pixels or special image pixels. Application-specific data generated by auto-focus pixels 212 may, for example, be used to generate range images, to determine whether an image is in focus, etc.

If desired, application-specific data from auto-focus pixels 212 may be used to map image data from the array of imaging pixels 190 to depth information. The term "imaging pixel" may be used to describe a pixel that gathers color image data to be used in generating images of a real-world scene. Auto-focus pixels 212 may be used to enhance the images produced by imaging pixels 190 and/or may be used to perform other functions. For example, auto-focus pixels 212 may gather application-specific data such as depth information that may be used by processing circuitry 18 (FIG. 1) to determine whether the image is in focus and/or to determine a focal point for lenses 14. Camera module 12 and processing circuitry 18 may use the depth information to perform auto-focus operations to automatically and rapidly focus image sensor 16 on a particular object in a real-world scene (e.g., by adjusting lenses 14), thereby enhancing the image generated by imaging pixels 190.

Array 201 may contain, for example, hundreds or thousands of rows and columns of image sensor pixels 190 and application-specific pixels 212. Control circuitry 202 may include row control circuitry 194 and column circuitry such as column control and readout circuitry 204. Row control circuitry 194 may be used to supply control signals such as reset, transfer, and read control signals to pixels 190 and application-specific pixels 212 over control paths 206. One or more conductive lines such as column lines 40 may be coupled to each column of pixels in array 201. Column lines 40 may be used for reading out image signals from pixels 190 and auto-focus pixels 212 and for supplying bias signals (e.g., bias currents or bias voltages) to pixels 190 and auto-focus pixels 212. During pixel readout operations, a pixel row in array 201 may be selected by row control circuitry 194 and image data associated with imaging pixels 190 and auto-focus pixels 212 in that pixel row can be read out along column lines 40. Image data and application-specific data may be read out from array 201 using any desired readout scheme. For example, image data may be readout from imaging pixels 190 and application-specific data may be readout from auto-focus pixels 212 on a row-by-row basis (e.g., using a rolling shutter readout scheme).

Column circuitry such as column control and readout circuitry 204 may be coupled to imaging pixels 190 and auto-focus pixels 212 using column lines 40. Column circuitry 204 may include sample-and-hold circuitry, amplifier circuitry, analog-to-digital conversion circuitry, bias circuitry such as pixel column bias supply circuits (e.g., circuitry such as current mirror circuitry for providing bias currents to source follower transistors of imaging pixels 190 and auto-focus pixels 212 along a pixel column), memory or other circuitry for operating imaging pixels 190 and auto-focus pixels 212 and for reading out image signals from imaging pixels 190 and auto-focus pixels 212.

As shown in FIG. 2, rows of auto-focus pixels 212 may be interposed between rows of imaging pixels 190 (e.g., a first row of auto-focus pixels 212 may be interposed between first and second rows of imaging pixels 190, etc.). Rows of auto-focus pixels 212 may be formed on array 201 at regular intervals. For example, a row of auto-focus pixels 212 may be formed at every 50 rows of array 201, at every 100 rows, every 500 rows, every 1,000 rows, or at any other desired interval on array 201. If desired, processing circuitry 18 may store information about which rows in array 201 are formed from auto-focus pixels 212. In scenarios where array 201 is read out on a row-by-row basis, processing circuitry 18 may identify application-specific data that is read out from rows of auto-focus pixels 212 and may process the application-specific data to determine whether the image is in focus. This is, however, merely illustrative. Auto-focus pixels 212 may, in general, be formed in any suitable location in array 201. For example, auto-focus pixels 212 may be formed as one or more rows in array 201, one or more columns in array 201, one or more clusters of pixels in array 201 (e.g., one or more microarrays in array 201), one or more single pixels in array 201, etc. If desired, auto-focus pixels 212 may be formed in every column of a given row of array 201 or may be formed on a subset of the columns within a given row of array 201.

Figure 3:
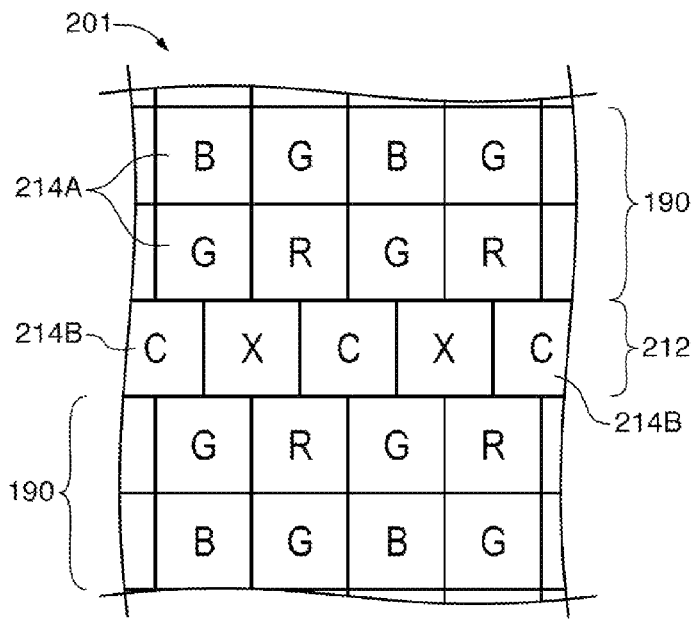
FIG. 3 is a top view of a portion of an illustrative pixel array having imaging pixels and rows of auto-focus pixels with offset color filter elements in accordance with an embodiment of the present invention.

A top view of a portion of pixel array 201 having imaging pixels 190 and auto-focus pixels 212 is shown in FIG. 3. Pixel array 201 may include imaging pixels 190 arranged in rows and columns. Each imaging pixel 190 may include an associated imaging pixel circuit (e.g., an associated light collecting region such as a photodiode). A corresponding filter element such as color filter elements 214A may be formed over each imaging pixel 190 in array 201. In the example of FIG. 3, color filters 214A are formed in a Bayer pattern of red color filter elements, blue color filter elements, and green color filter elements. This is, however, merely illustrative. If desired, color filters 214A may be formed in a cyan-magenta-yellow-key pattern, in a red-clear-clear-blue pattern, in a red-yellow-yellow-blue pattern, with infrared color filter elements, or in any other desired pattern.

Pixel array 201 may include auto-focus pixels 212. Each auto-focus pixel 212 may include an associated auto-focus pixel circuit (e.g., an associated light collecting region such as a photodiode). In the example of FIG. 3, auto-focus pixels 212 are formed as a row of auto-focus pixels interposed between two rows of imaging pixels 190. Filters elements such as color filters elements 214B may be formed over the row of auto-focus pixels 212. In the example of FIG. 3, auto-focus pixels 212 are covered by first color filter elements C optimized to pass light of a first wavelength band and second color filter elements X optimized to pass light of a second wavelength band. Color filter elements 214B may pass different colors of light than color filter elements 214A or may pass one or more of the same colors of light as filter elements 214A. In one suitable arrangement, color filter elements C may be optimized to pass white light and may sometimes be referred to herein as clear color filter elements, white color filter elements, or clear filter elements. Clear filter elements C may be formed with a visibly transparent color filter that transmits light across the visible light spectrum. In another suitable arrangement, clear filter elements C may represent portions of array 201 that are formed without any color filter elements. The sensitivity of clear filter elements C may, if desired, be adjusted for better color reproduction and/or noise characteristics through use of light absorbers such as pigments. Color filter elements X may be optimized to block visible light. For example, color filter elements X may be black (opaque) color filter elements that block substantially all visible light (e.g., color filter elements that substantially absorb light received across the visible spectrum). The example in which color filter elements C are clear and color filter elements X are black are merely illustrative. If desired, color filter elements C and X may transmit light of any desired wavelengths.

The light gathering pixel circuits associated with auto-focus pixels 212 may be arranged in the same columns of array 201 as the light gathering pixel circuits associated with imaging pixels 190, whereas color filters 214B formed over auto-focus pixels 212 may be offset (e.g., staggered or skewed) relative to color filters 214A formed over imaging pixels 190 (e.g., so that the angular pixel response of auto-focus pixels 212 is different from that of imaging pixels 190). For example, each imaging pixel 190 located in the first column of array 201 may be covered by an associated color filter element 214A, whereas auto-focus pixel 212 located in the first column of array 201 may be covered by some of an associated clear color filter element C and some of an associated black color filter element X (e.g., color filter elements 214A may be offset so that each column of array 201 includes half of a first color filter element 214B and half of a second color filter element 214B). In this way, each imaging pixel 190 may generate image signals in response to light of a single color received through a single color filter element 214A, whereas auto-focus pixels 212 may generate signals in response to light received through two different color filter elements 214B. In the example of FIG. 3, auto-focus pixels 212 may generate signals in response to light received through clear filter elements C while light from some portions of the imaged scene is blocked by black color filter elements X.

In general, imaging pixels 190 receive light over all incident angles, whereas light received over a subset of incident angles may be blocked from being received by application-specific pixels such as auto-focus pixels 212. In the example of FIG. 3, black color filter elements X may block light from some portions of the imaged scene (e.g., light received from a particular direction or a particular subset of incident angles). By blocking light from some incident angles from being received by auto-focus pixels 212 using color filter elements X, auto-focus pixels 212 may generate signals in response to receiving light from a predetermined subset of incident angles. Processing circuitry 18 may use the signals generated by auto-focus pixels 212 to determine whether portions of the imaged scene are in focus (e.g., for use in auto-focusing operations). Image data generated by imaging pixels 190 may be gathered during pixel readout operations and may be subsequently used to generate an image of a real-world scene. During pixel readout operations, pixel values from auto-focus pixels 212 may be substituted with interpolated values of signals based on neighboring imaging pixel values from imaging pixels 190.

Figure 4:
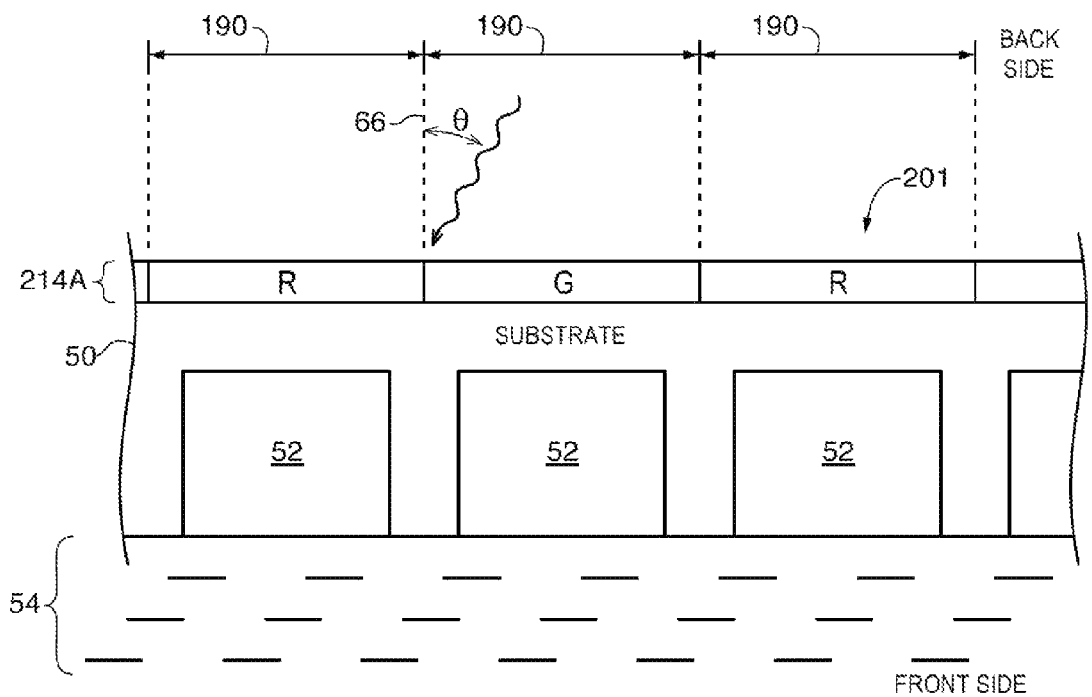
FIG. 4 is a cross-sectional side view of a portion of a row of imaging pixels in a backside illuminated pixel array in accordance with an embodiment of the present invention.

A cross-sectional side view of a row of pixel array 201 having imaging pixels 190 is shown in FIG. 4 (e.g., a row of imaging pixels such as the second row of array 201 shown in FIG. 3). Pixel array 201 may be a pixel array for a backside illumination image sensor. As shown in FIG. 4, pixels 190 may have a substrate such as substrate 50. Substrate 50 may be formed from silicon or other suitable materials. A photosensor such as photodiode 52 may be formed in substrate 50 for each imaging pixel 190. Color filter elements 214A (also known as a color filter array or color filter layer) may be formed on substrate 50 on an opposite surface of substrate 50 from photodiodes 52. Interconnect layers 54 (also known as metallization layers) may be formed on substrate 50 over photodiodes 52, on the same surface of substrate 50 as photodiodes 52. Interconnect layers 54 may have metal and dielectric regions that are used to route signals on pixel array 201. If desired, microlenses (not shown) may be formed above color filter layer 214A for directing incident light 60 towards associated photo sensitive regions 52.

The surface of substrate 50 at which photodiodes 52 are formed may sometimes be referred to as the front side or front surface of substrate 50, whereas the surface of substrate 50 that opposes the surface of substrate 50 at which photodiodes 52 are formed may sometimes be referred to as the back side or back surface of substrate 50. In other words, photodiode 52 may be formed in substrate 50 at the front surface, metallization layers 54 may be formed over substrate 50 at the front surface, and color filter elements 214A may be formed over substrate 50 at the back surface. In the example of FIG. 4, array 201 is formed as a part of a back side illuminated image sensor that receives image light 60 at angle θ relative to normal axis 66 through the back surface of substrate 50.

In order to determine depth (range) information from an imaged scene and/or to determine whether an image is in focus, auto-focus pixels 212 on array 201 generally need to receive light from the scene over a subset of incident angles (e.g., light from a particular direction). In scenarios where a front-side illuminated image sensor is used (e.g., when image light is received from a scene through the front side of substrate 50), metallization layers 54 formed on the front side of substrate 50 may be used to block image light received from a scene over a subset of angles. However, when a backside illuminated image sensor is used, metallization layers 54 do not block any incident light from being received by photodiodes 52 through the back side of substrate 50. If desired, color filter elements 214B may be formed over some pixels in array 201 such as auto-focus pixels 212 for blocking out incident light received at selected incident angles.

Figure 5:
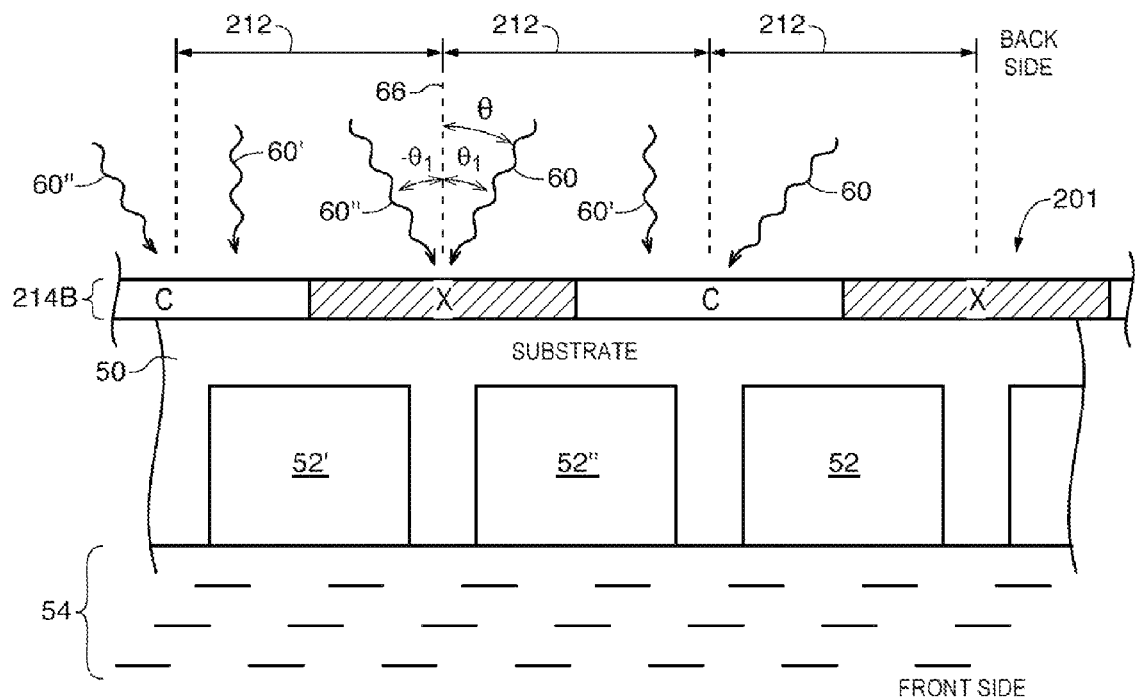
FIG. 5 is a cross-sectional side view of a portion of a row of auto-focus pixels having color filter elements that block some angles of incident light in a backside illuminated pixel array in accordance with an embodiment of the present invention.

A cross-sectional side view of a row of backside illuminated pixel array 201 having auto-focus pixels 212 is shown in FIG. 5 (e.g., a row of auto-focus pixels such as the third row of array 201 shown in FIG. 3). As shown in FIG. 5, pixels 212 may include a photosensitive region 52 formed in the front side of substrate 50. Color filter elements 214B may be formed over the back surface of substrate 50. Each color filter element 214B may be formed in a common plane. For example, color filter elements 214B may be formed in a common plane with color filter elements 214A of FIG. 4. Interconnect layers 54 (also known as metallization layers) may be formed over the front surface of substrate 50. If desired, microlenses (not shown) may be formed above color filter layer 214B for directing incident light 60 towards associated photo sensitive regions 52.

Backside illuminated array 201 may receive image light at an angle θ relative to normal axis 66. Imaging pixels 190 as shown in FIG. 4 may receive image light over all angles θ from −90 degrees to +90 degrees. In the example of FIG. 5, array 201 receives image light 60 at angle $\theta_1$, image light 60' at a perpendicular angle relative to the back surface of substrate 50 (e.g., at an angle of θ=0), and image light 60" at angle $-\theta_1$. Black color filters X may block incident light from being received by photosensitive regions 52 in some auto-focus pixels 212 from a portion (subset) of the angles θ between −90 degrees and +90 degrees. In the example of FIG. 5, image light 60 received at angle $\theta_1$ is blocked from being received by left photosensitive region 52' by black color filter X, whereas image light 60 is transmitted by clear filter C and received by middle photosensitive region 52". Image light 60" received at angle $-\theta_1$ is blocked from being received by middle photosensitive region 52", whereas image light 60" is transmitted by clear filter C and received by left photosensitive region 52'. Image light 60' at a perpendicular angle relative to the back surface of substrate 50 is transmitted by clear filter C and absorbed by photosensitive regions 52' and 52". In this way, each pair of adjacent auto-focus pixel 212 may receive light over respective portions (subsets) of incident angles while blocking out image light received at other incident angles. Each auto-focus pixel 212 in each adjacent pair of auto-focus pixels may have a different angular pixel output because different incident angles of light are blocked by a corresponding black color filter element X.

Figure 6:
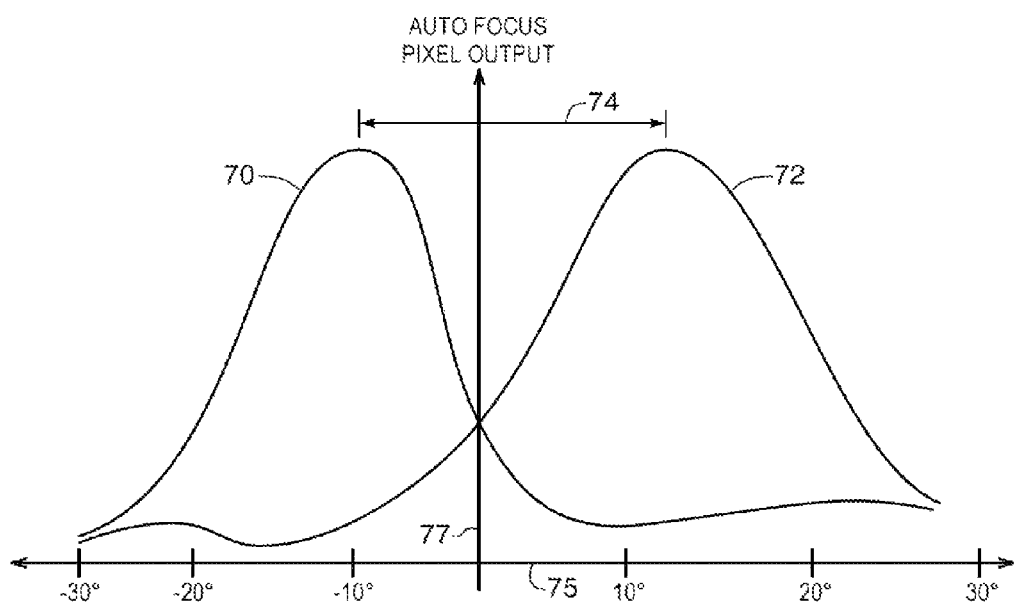
FIG. 6 is an illustrative graph showing the angular pixel response of adjacent auto-focus pixels in a backside illuminated pixel array that may be used to determine whether an image is in focus in accordance with an embodiment of the present invention.

FIG. 6 is an illustrative plot showing how pixel output may vary as a function of incident angle for adjacent auto-focus pixels 212 in array 201. The horizontal axis 75 represents incident angle θ in degrees relative to normal axis 66 (as shown in FIG. 5). The vertical axis 77 represents the pixel output (e.g., angular pixel response) of auto-focus pixels 212. Curve 70 may represent the pixel output of a first auto-focus pixel 212 as a function of the incident angle of light received at the back surface of array 201 and curve 72 may represent the pixel output of a second auto-focus pixel 212 that is adjacent to the first auto-focus pixel as a function of incident angle. For example, curve 70 may be the pixel output of the left-most auto-focus pixel 212 shown in FIG. 5, whereas curve 72 may be the pixel output of the middle auto-focus pixel 212 shown in FIG. 5. Curve 70 may have attenuated portions for positive angles θ because image light received at positive angles θ may be blocked by a given black color filter element X (e.g., as shown in FIG. 5). Curve 70 may have a peak at a negative incident angle because incoming light received at negative incident angles may be transmitted by a first clear color filter element C and absorbed by the associated photosensitive region. Curve 72 may have an attenuated portion for negative angles θ because image light received at negative incident angles may be blocked by the given black color filter element X. Curve 72 may have a peak at a positive angle because image light received at positive incident angles may be transmitted by a second clear color filter element (e.g., a clear color filter element formed on an opposing side of the black color filter element from the first clear color filter element).

In the example of FIG. 6, the peaks of curves 70 and 72 may be separated by margin 74. As the focal length of lens 14 (FIG. 1) is adjusted, curves 70 and 72 may be shifted left or right depending on how the incident light is focused onto array 201. When angular pixel output curves for adjacent auto-focus pixels 212 such as curves 70 and 72 are aligned, the image light incident on array 201 may be in focus. For example, when the peak of curve 70 is aligned with the peak of curve 72, the incident light may be in focus. Angular pixel response such as the angular pixel response represented by curves 70 and 72 may be analyzed by processing circuitry 18 to perform auto-focus operations on camera module 12.

Figure 7:
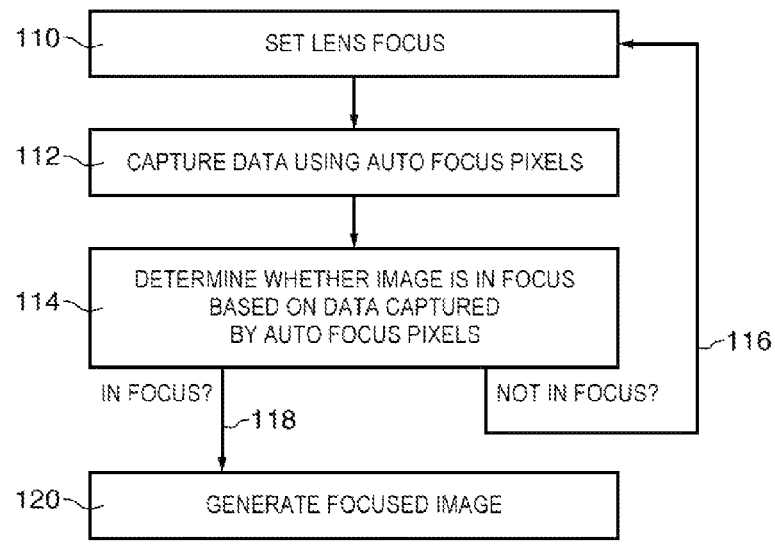
FIG. 7 is a flow chart of illustrative steps involved in performing auto-focus operations using an electronic device having a backside illuminated pixel array with auto-focus pixels in accordance with an embodiment of the present invention.

FIG. 7 is a flow chart of illustrative steps that may be performed by imaging system 10 to generate focused images. The steps of FIG. 7 may, for example, be performed by backside illuminated image sensor 16 having backside illuminated pixel array 201 with rows of auto-focus image pixels 212.

At step 110, processing circuitry 18 may set the focus of lens 14. For example, processing circuitry 18 may provide control signals to camera module 12 that configure lens 12 with a given focal length (e.g., so that objects at a particular distance from camera module 12 are in focus at image sensor 16).

At step 112, backside illuminated pixel array 201 may capture pixel data from the light that is focused onto array 201. For example, imaging pixels 190 in array 201 may capture image data and auto-focus pixels 212 may capture (generate) auto-focus data in response to the received light (sometimes referred to herein as application-specific data). The auto-focus data captured by auto-focus pixels 212 may, for example, include angular pixel output curves such as curves 70 and 72 as shown in FIG. 6. Camera module 12 may pass the image data and/or the auto-focus data to processing circuitry 18.

At step 114, processing circuitry 18 may process the image data and/or the auto-focus data to determine whether one or more objects in the image are in focus. In one suitable arrangement, a user of imaging device 10 may select an object of interest in the imaged scene (sometimes referred to herein as an interest point) and processing circuitry 18 may determine whether the object of interest is in focus. In another suitable arrangement, processing circuitry 18 may autonomously identify objects of interest (interest points) in the imaged scene such as a face, a person, a moving object, or any other desired object using the image data captured by imaging pixels 190 and/or the auto-focus data captured by auto-focus pixels 212. For example, processing circuitry 18 may implement a face detection algorithm to automatically detect faces in an imaged scene and to identify those faces as interest points. Processing circuitry 18 may determine whether the identified object of interest is in focus (e.g., using the auto-focus data captured by auto-focus pixels 212). If desired, processing circuitry 18 may determine whether objects in the imaged scene are in focus by comparing angular pixel outputs from adjacent auto-focus pixels 212 such as curves 70 and 72 of FIG. 6 (e.g., by determining whether the peaks of curves 70 and 72 overlap).

If processing circuitry 18 determines that the image is not in focus (e.g., that the objects of interest in the imaged scene are not in focus), processing may loop back to step 110 as shown by path 116 to adjust the focus of lens 14. For example, processing circuitry 18 may autonomously instruct lens 14 to change focal lengths and imaging device 10 may determine whether the scene or objects of interest are in focus when captured using the new focal length. If processing circuitry 18 determines that the image is in focus (e.g., that the objects of interest in the imaged scene are in focus), processing may proceed to step 120 as shown by path 118.

At step 120, processing circuitry 18 may generate a focused image using the image data captured by imaging pixels 190. If desired, processing circuitry 18 may interpolate image values for the rows of auto-focus pixels 212 using the image data generated by imaging pixels 190. Processing circuitry 18 may perform additional image processing operations on the focused image (e.g., white balance operations, noise correction operations, gamma correction operations, etc.). If desired, processing circuitry 18 may store the focused image in memory and/or convey the focused image to additional processing circuitry or display equipment. In this way, auto-focus pixels 212 on back side illuminated array 201 may generate data that is used to automatically focus lenses 14 on one or more objects of interest in the scene. If desired, auto-focus pixels 212 may be used to generate range information such as one or more depth maps or other three dimensional information about an imaged scene.

Figure 8:
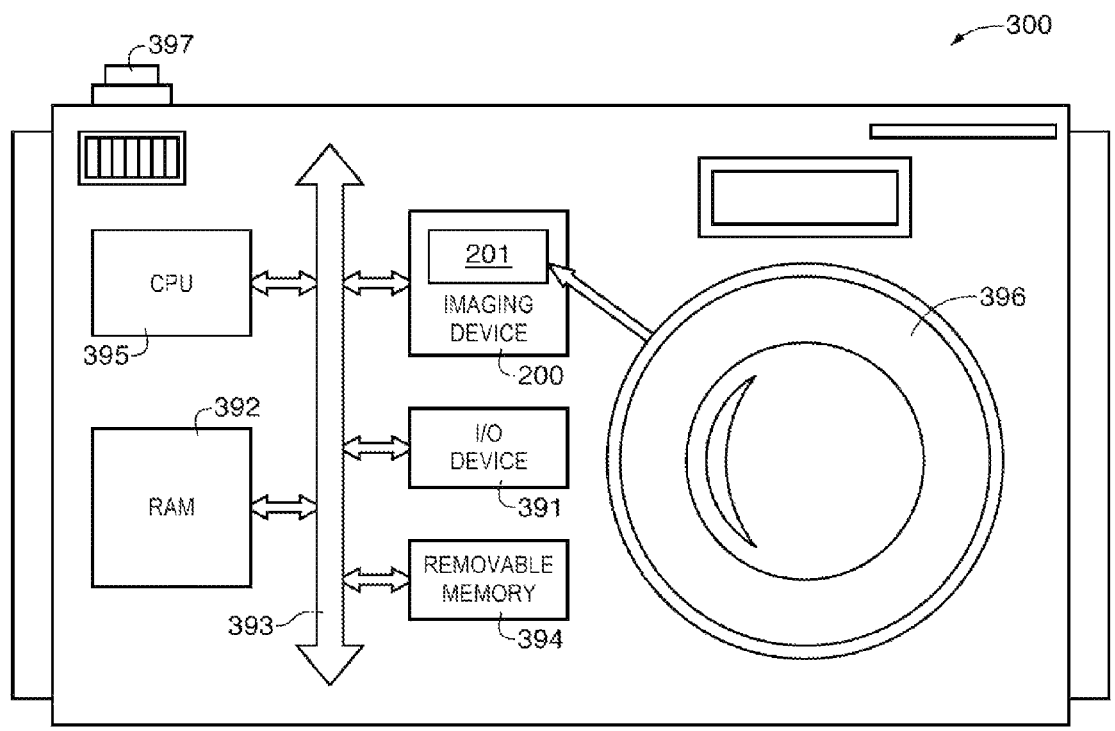
FIG. 8 is a block diagram of an imager employing the embodiment of FIGS. 1-7 in accordance with an embodiment of the present invention.

FIG. 8 shows in simplified form a typical processor system 300, such as a digital camera, which includes an imaging device 200. Imaging device 200 may include a backside illuminated pixel array 201 of the type shown in FIGS. 2-5 having imaging pixels and auto-focus pixels with offset color filter elements as described above. Processor system 300 is exemplary of a system having digital circuits that may include imaging device 200. Without being limiting, such a system may include a computer system, still or video camera system, scanner, machine vision, vehicle navigation, video phone, surveillance system, auto-focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems and image sensors that have backside-illuminated pixel arrays having imaging pixels for generating image data and rows of application-specific auto-focus pixels for generating application-specific data.

The backside-illuminated pixel array may include a substrate having an array of photodiodes arranged in rows and columns at a front side of the substrate. Metal interconnects and dielectric layers may be formed over the front side of the substrate. The array of photodiodes may include a first set of photodiodes corresponding to the imaging pixels and a second set of photodiodes corresponding to the auto-focus pixels. The pixel array may include a first set of color filter elements formed over the back side of the substrate so that each color filter element in the first set is formed over a respective imaging pixel photodiode. The first set of color filter elements may include color filters that pass light of a particular color (e.g., a particular wavelength band).

The array may include a second set of color filter elements formed over the back side of the substrate so that each color filter element in the second set is formed over an associated pair of auto-focus pixel photodiodes (e.g., the color filter elements associated with the auto-focus pixels may be offset or staggered with respect to the color filter elements formed over the imaging pixels). For example, each color filter element associated with the auto-focus pixels may have a first portion (e.g., a first half) that is formed over an associated first auto-focus pixel photodiode and a second portion (e.g., a second half) formed over an associated second auto-focus pixel photodiode. The second set of color filter elements may include clear color filter elements and opaque color filter elements interspersed between the clear color filter elements. The auto-focus pixels may be formed in predetermined rows of the pixel array and with any desired row spacing (e.g., every 200 rows, every 100 rows, etc.). The photodiodes of the imaging pixels may receive image light at a set of incident angles. The opaque color filter elements may block image light received over a subset of the incident angles from being received by the photodiodes of the auto-focus pixels.

The pixel array may be coupled to processing circuitry that performs auto-focusing operations based on the generated auto-focus data. For example, the imaging system may include an adjustable lens that focuses light onto the pixel array. The processing circuitry may determine whether an image or points of interest in the image are in focus based on the application-specific data generated by the auto-focus pixels. The processing circuitry may instruct the adjustable lens to change focal lengths in response to determining that the image or points of interest are not in focus. The imaging pixels may capture subsequent image data that is in focus and may generate interpolated pixel values for the auto-focus image based on the image data.

The imaging system with a backside illuminated pixel array having rows of auto-focus pixels with offset color filter elements and the associated techniques for performing auto-focus operations may be implemented in a system that also includes a central processing unit, memory, input-output circuitry, and an imaging device that further a data converting circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging system, comprising:
    a substrate having an array of photodiodes arranged in rows and columns, wherein the array comprises a first set of photodiodes and a second set of photodiodes that is different from the first set of photodiodes;
    a first set of color filter elements, wherein each color filter element in the first set is formed over a respective photodiode in the first set of photodiodes, wherein the first set of photodiodes is configured to generate image data in response to light received through the first set of color filter elements;
    a second set of color filter elements formed over the second set of photodiodes, wherein the second set of color filter elements is offset with respect to the first set of color filter elements, wherein the second set of photodiodes is configured to generate auto-focus data in response to light received through the second set of color filter elements, wherein each color filter element in the second set of color filter elements is formed over an associated pair of photodiodes in the second set of photodiodes, wherein the second set of photodiodes comprise a row of photodiodes in the array of photodiodes, and wherein the row of photodiodes is interposed between at least two rows of photodiodes from the first set of photodiodes.

2. The imaging system defined in claim 1, wherein the second set of photodiodes further comprises an additional row of photodiodes in the array of photodiodes and wherein the additional row of photodiodes is interposed between at least two additional rows of photodiodes from the first set of photodiodes.

3. The imaging system defined in claim 1, wherein the second set of color filter elements comprises a plurality of opaque color filter elements configured to substantially block visible light.

4. The imaging system defined in claim 3, wherein the substrate has opposing front and back surfaces, wherein the array of photodiodes is formed in the substrate at the front surface, and wherein the first and second sets of color filter elements are formed over the back surface of the substrate.

5. The imaging system defined in claim 4, wherein the array of photodiodes is configured to receive image light through the back surface, wherein the first set of photodiodes is configured to receive the image light at a plurality of incident angles, and wherein each opaque color filter element in the plurality of opaque color filter elements is configured to block image light received at a subset of the plurality of incident angles from being received at an associated one of the second set of photodiodes.

6. The imaging system defined in claim 1, wherein the second set of color filter elements comprises a plurality of clear color filter elements.

7. The imaging system defined in claim 6, wherein the second set of color filter elements further comprises a plurality of black color filter elements, wherein each black color filter element in the plurality of black color filter elements is interposed between an associated pair of clear color filter elements in the plurality of clear color filter elements.

8. The imaging system defined in claim 1, the further comprising processing circuitry that is configured to determine whether an image is in focus based on the auto-focus data and wherein the processing circuitry is configured to generate a focused image based on the image data in response to determining that the image is in focus.

9. The imaging system defined in claim 8, wherein the processing circuitry is further configured to generate interpolated image data for the second set of photodiodes based on the image data generated by the first set of photodiodes.

10. The imaging system defined in claim 1, wherein the processing circuitry is further configured to generate interpolated image data for the second set of photodiodes based on the image data generated by the first set of photodiodes.

11. The imaging system defined in claim 1, wherein the second set of photodiodes comprise a row of photodiodes in the array of photodiodes and wherein the row of photodiodes is interposed between at least two rows of photodiodes from the first set of photodiodes.

12. A backside illuminated pixel array in an image sensor, comprising:
 imaging pixels arranged in rows and columns, wherein the imaging pixels are configured to generate image data;
 a row of application-specific pixels interposed between at least two rows of the imaging pixels, wherein the row of application-specific pixels is configured to generate application-specific data;
 first color filter elements formed over the imaging pixels, wherein the first color filter elements are configured to pass light of a first wavelength band;
 second color filter elements formed over the row of application-specific pixels, wherein the second color filter elements are configured to pass light of a second wavelength band that is different from the first wavelength band;
 opaque color filter elements formed over the row of application-specific pixels, wherein the opaque color filter elements are configured to substantially block visible light;
 third color filter elements formed over the imaging pixels, wherein the third color filter elements are configured to pass light of a third wavelength band that is different from the first and second wavelength bands; and
 fourth color filter elements formed over the imaging pixels, wherein the fourth color filter elements are configured to pass light of a fourth wavelength band that is different from the first, second, and third wavelength bands.

13. The backside illuminated pixel array defined in claim 12, wherein the second color filter elements comprise clear color filter elements configured to pass white light and wherein the opaque color filter elements comprise black color filter elements.

14. The backside illuminated pixel array defined in claim 13, wherein each of the first color filter elements, each of the third color filter elements, and each of the fourth color filter elements is formed over a respective imaging pixel, wherein a first portion of each of the second color filter elements is formed over an associated first application-specific pixel in the row of application-specific pixels, and wherein a second portion of each of the second color filter elements is formed over an associated second application-specific pixel in the row of application-specific pixels.

15. The backside illuminated pixel array defined in claim 14, wherein the first color filter elements comprise green color filter elements, wherein the third color filter elements comprise blue color filter elements, and wherein the fourth color filter elements comprise red color filter elements.

16. A system, comprising:
 a central processing unit;
 memory;
 input-output circuitry; and
 an imaging device, wherein the imaging device comprises:
  a backside illuminated pixel array having a plurality of imaging pixels and a plurality of application-specific pixels;
  a lens that focuses light onto the backside illuminated pixel array;
  an array of color filter elements formed over the plurality of imaging pixels, wherein each color filter element in the plurality of color filter elements is formed over an associated one of the plurality of imaging pixels;
  a plurality of opaque color filter elements formed over the application-specific pixels, wherein each opaque color filter element in the plurality of opaque color filter elements is formed over an associated pair of application-specific pixels in the plurality of application-specific pixels, wherein the imaging pixels are configured to generate image data and wherein the application-specific pixels are configured to generate application-specific data; and
  processing circuitry, wherein the processing circuitry is configured to adjust the lens based on the application-specific data and wherein the processing circuitry is configured to generate a focused image based on the image data.

17. The system defined in claim 16, wherein the lens has a first focal length and a second focal length that is different from the first focal length, wherein the processing circuitry is further configured to:
 identify an interest point in the generated image data;
 determine whether the interest point is in focus based on the application-specific data; and in response to determining that the interest point is not in focus, instructing the lens to switch between the first and second focal lengths.

18. The system defined in claim 16, wherein the imaging device further comprises:
a plurality of clear color filter elements, wherein each clear color filter element in the plurality of clear color filter elements is formed over an associated pair of application-specific pixels in the plurality of application-specific pixels, and wherein each opaque color filter element in the plurality of opaque color filter elements is interposed between an associated pair of clear color filter elements in the plurality of clear color filter elements.

* * * * *